(12) United States Patent
Wang et al.

(10) Patent No.: US 7,132,715 B2
(45) Date of Patent: Nov. 7, 2006

(54) SEMICONDUCTOR DEVICE HAVING A SPACER LAYER DOPED WITH SLOWER DIFFUSING ATOMS THAN SUBSTRATE

(75) Inventors: Qi Wang, West Jordan, UT (US); Amber Crellin-Ngo, Salt Lake City, UT (US); Hossein Paravi, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/851,764

(22) Filed: May 21, 2004

(65) Prior Publication Data

US 2005/0258481 A1    Nov. 24, 2005

(51) Int. Cl.
*H01L 27/108* (2006.01)
(52) U.S. Cl. .............. 257/330; 257/331; 257/332; 257/334; 257/328; 257/375
(58) Field of Classification Search ............ 257/330, 257/331, 332, 334, 328, 375
See application file for complete search history.

(56) References Cited

U.S. PATENT DOCUMENTS

| | | | | |
|---|---|---|---|---|
| 4,893,160 A * | 1/1990 | Blanchard | .................... | 257/334 |
| 5,814,858 A | 9/1998 | Williams | | |
| 6,057,588 A * | 5/2000 | Yamazaki | ................... | 257/506 |
| 6,331,467 B1 * | 12/2001 | Brown et al. | ............... | 438/270 |
| 6,686,251 B1 * | 2/2004 | Igarashi | ...................... | 438/364 |
| 2003/0203593 A1 * | 10/2003 | Beaman | ..................... | 438/419 |
| 2004/0171229 A1 * | 9/2004 | Beasom | ..................... | 438/455 |

* cited by examiner

*Primary Examiner*—Nathan J. Flynn
*Assistant Examiner*—Tan Tran
(74) *Attorney, Agent, or Firm*—Thomas R. FitzGerald, Esq.; Hiscock & Barclay, LLP

(57) ABSTRACT

A semiconductor device includes a silicon substrate heavily-doped with phosphorous. A spacer layer is disposed over the substrate and is doped with dopant atoms having a diffusion coefficient in the spacer layer material that is less than the diffusion coefficient of phosphorous in silicon. An epitaxial layer is also disposed over the substrate. A device layer is disposed over the substrate, and over the epitaxial and spacer layers.

38 Claims, 5 Drawing Sheets

Figure 1. The dependence of Rdson10 and BVDSS on the thickness of Epi spacer. The solid circles are Rdson10 data. The diamonds are BVDSS data. The dash-line indicates the current level of Rdson10 and BVDSS for As-doped substrate.

Figure 3  The diffusion coefficients of phosphorus, antimony, and arsenic in silicon.

Figure 4 The SRP resistivity measurements of three different epi structures on phosphorus substrate with resistivity of 1.3mΩ-cm. Note the profile of 4.0um+1.5um intrinsic (open circle) is identical to that of 5.0um+0.5um (solid circle).

SEMICONDUCTOR DEVICE HAVING A SPACER LAYER DOPED WITH SLOWER DIFFUSING ATOMS THAN SUBSTRATE

FIELD OF THE INVENTION

The present invention relates generally to semiconductor devices and, more particularly, to the epitaxial layer of semiconductor devices.

DESCRIPTION OF THE RELATED ART

The resistivity of silicon wafers heavily doped with phosphorous (P) can be less than one one-thousandth (0.001) ohms-centimeter (ohms-cm). Substrates with such low resistivity are desirable for many reasons, including the ability to form thereon devices having improved conduction or reduced on-state resistance.

Devices fabricated from heavily phosphorous-doped silicon wafers may require measures to prevent the diffusion of phosphorous atoms from the substrate into the active or device region that can occur during fabrication processes that are carried out at elevated temperatures, such as, for example, annealing. Increasing the thickness of the device epitaxial layer, or adding an epitaxial layer/spacer to the device, is one measure that can be used to reduce the effects of such diffusion. The use of a thicker or additional epitaxial layer/spacer increases the separation between the substrate and the device/active region, and thereby reduces the impact of the diffusion of phosphorous. However, the higher resistivity of a thicker or additional epitaxial layer (relative to the substrate) significantly and undesirably increases the on-state resistance of the device.

Therefore, what is needed in the art is a semiconductor device having a structure that reduces diffusion of phosphorous atoms into the device/active region from a substrate that is heavily-doped with phosphorous and yet maintains a relatively low on-state resistance, and a method of forming same.

Furthermore, what is needed in the art is a semiconductor device having a relatively thick epitaxial layer with a relatively low or reduced resistivity and which reduces diffusion of phosphorous atoms from a substrate that is heavily-doped with phosphorous into the device/active region, and a method of forming same.

SUMMARY OF THE INVENTION

The present invention provides a semiconductor device and structure that substantially reduces diffusion of phosphorous atoms from a heavily-doped phosphorous substrate to the device active layer.

The invention comprises, in one form thereof, a semiconductor device having a silicon substrate heavily-doped with phosphorous. A spacer layer is disposed over the substrate and is doped with dopant atoms having a diffusion coefficient in the spacer layer material that is less than the diffusion coefficient of phosphorous in silicon. An epitaxial layer is also disposed over the substrate. A device layer is disposed over the substrate, and over the epitaxial and spacer layers.

An advantage of the present invention is that diffusion of phosphorous atoms from the heavily-doped phosphorous substrate to the device active layer is substantially reduced.

Another advantage of the present invention is that the impact of the spacer-layer on the device on-state resistance is reduced.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
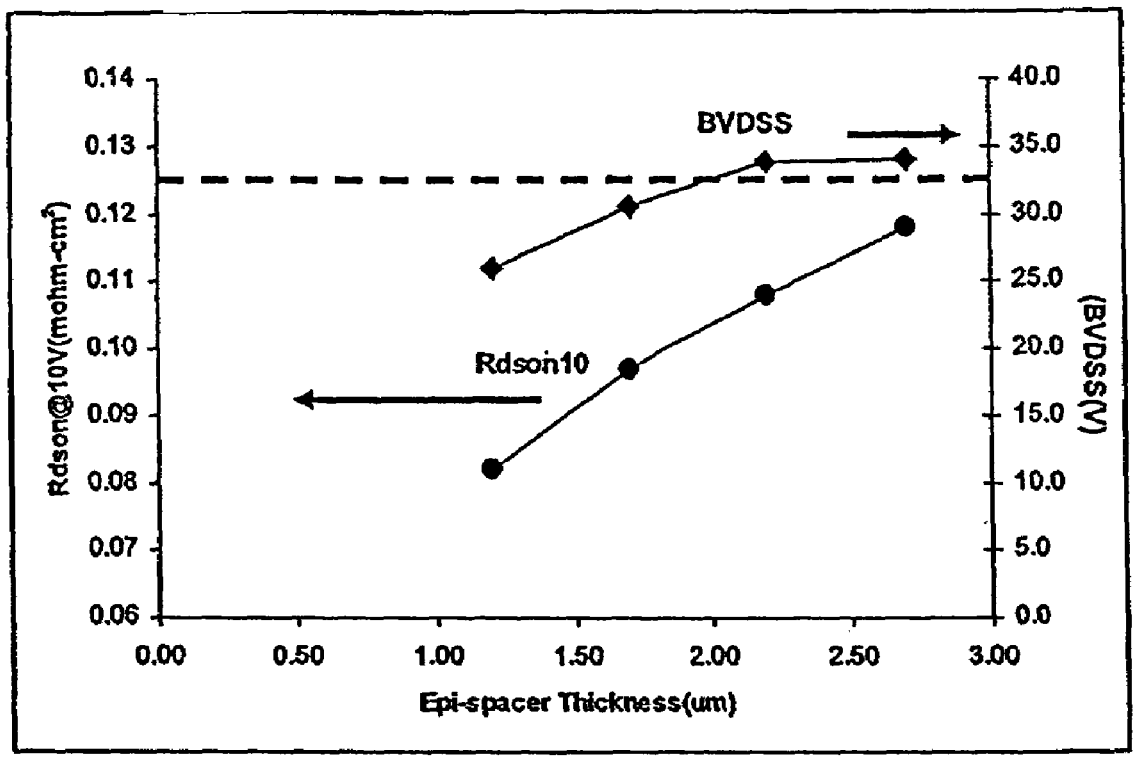
FIG. 1 plots the drain-to-source resistance ($R_{DSon}$) and the wafer-level breakdown voltage (BVDSS) as a function of the thickness of the epitaxial spacer layer of a device formed on a substrate heavily doped with phosphorous atoms.

Referring now to the drawings and particularly to FIG. 1, the drain-to-source resistance ($R_{DSon}$) and the wafer-level breakdown voltage (BVDSS) are plotted as a function of the thickness of the epitaxial layer or spacer of a device formed on a substrate heavily doped with phosphorous atoms. The plot of $R_{DSon}$ corresponds to an applied gate voltage of 10 Volts. The resistivity of the epitaxial layer or spacer is the same as the resistivity of the active/device region. The dashed line in FIG. 1 represents typical levels of $R_{DSon}$ and BVDSS for a device formed on an arsenic-doped substrate but otherwise identical to the device formed on the phosphorous doped substrate.

As is apparent from FIG. 1, both $R_{DSon}$ and BVDSS increase rapidly with the thickness of the epitaxial layer/spacer in the device formed on the phosphorous-doped substrate. As is also apparent from FIG. 1, a phosphorous-doped substrate requires increasing the thickness of the epitaxial layer by, or adding an epitaxial spacer layer having a thickness of, approximately 2 microns ($\mu$) in order to achieve a BVDSS that is equivalent to the BVDSS of the device formed on the arsenic-doped substrate as represented by the dashed line. However, increasing the thickness of the epitaxial layer by, or adding an epitaxial spacer having a thickness of, approximately 2 microns ($\mu$) increases $R_{DSon}$ by approximately thirty percent relative to a device having an epitaxial layer/spacer approximately 1.2$\mu$ thick. It is desirable to achieve the reduction in diffusion of phosphorous atoms that is achieved by increasing the thickness of the epitaxial layer/spacer and yet avoid the increase in $R_{DSon}$.

Figure 2:
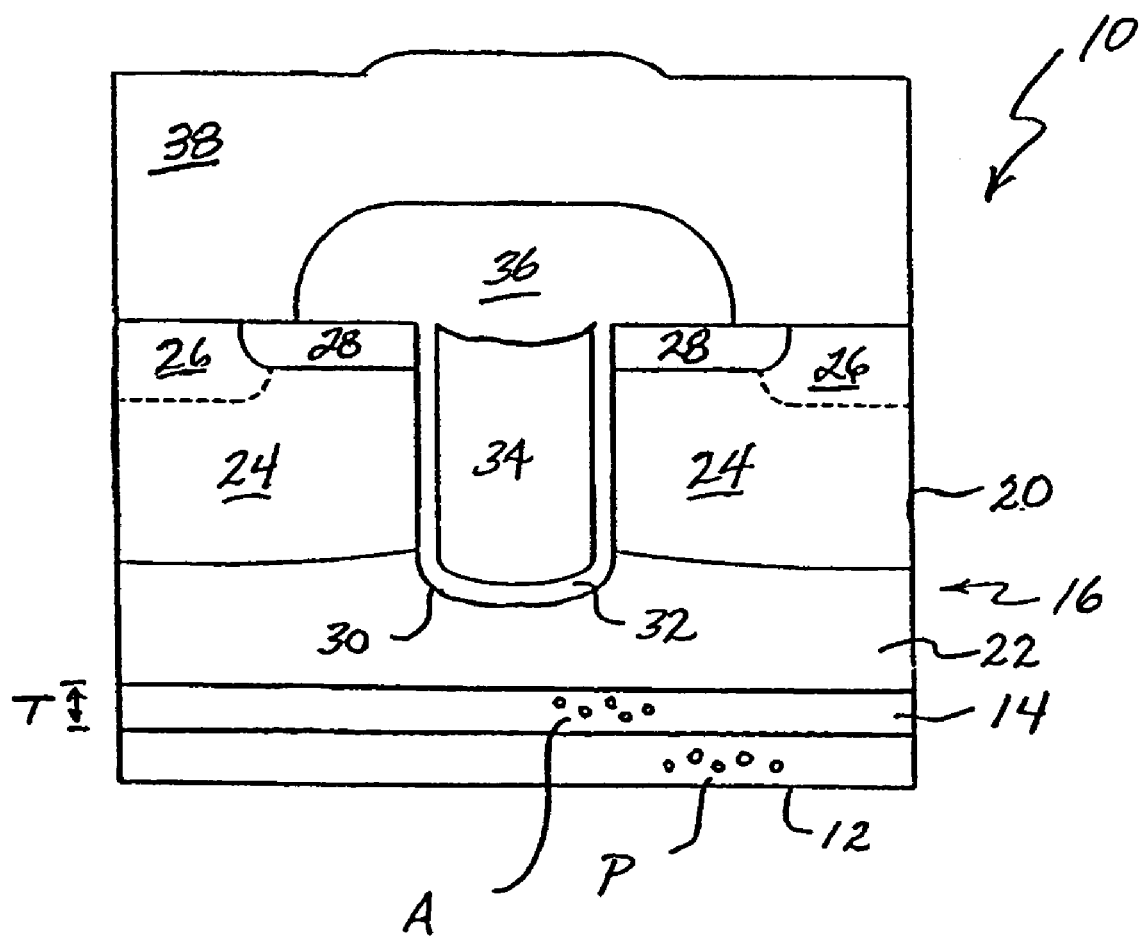
FIG. 2 is a cross-sectional view of a portion of one embodiment of a semiconductor device of the present invention.

Referring now to FIG. 2, one embodiment of a semiconductor device of the present invention is shown. Semiconductor device 10, such as, for example, an N-type metal oxide semiconductor field effect transistor (MOSFET), includes substrate 12, epitaxial spacer 14, and epitaxial layer 16. Within epitaxial layer 16 is formed device/active layer 20 and drain region 22. Device 10 also includes various features and structures, such as, for example, trenches, gates, sources, etc, formed within device layer 20. The particular embodiment of device 10 shown includes P– well regions 24, P+ body regions 26, N+ source regions 28, and gate trench 30 which is lined with gate dielectric material 32 and is filled with gate conductive material 34. Interlevel dielectric layer 36 is deposited over gate trench 30 and partially over sources 28, and metal layer 38 is also deposited, by procedures and for purposes well known in the art.

Substrate 12 is an N+ silicon substrate that is heavily N+ doped with phosphorous atoms P. Substrate 12 is doped to a dopant concentration of, for example, greater than 5E18 phosphorous atoms/cm$^{-3}$.

Epitaxial spacer 14 is a layer of N-type silicon having a thickness T that is formed or epitaxially grown over substrate 12. Thickness T of epitaxial spacer 14 is dependent at least in part upon the total thermal budget of the particular technology family to which device 10 belongs or in which device 10 is classified. Semiconductor devices within a technology family are generally exposed to common fabrication processes, some of which occur or are carried out at elevated temperatures. Elevated temperatures facilitate diffusion of the phosphorous dopant atoms from within substrate 12 to the active/device region 20. Thus, thickness T of first epitaxial spacer 14 is increased or relatively large when device 10 has a relatively high thermal budget, i.e., is to be exposed to a relatively large number of elevated-temperature fabrication processes that encourage diffusion of the phosphorous atoms from substrate 10 to active/device layer 20. Conversely, thickness T of epitaxial spacer 14 is reduced or relatively small when device 10 has a smaller thermal budget and therefore is to be exposed to fewer diffusion-generating elevated temperature processes.

Epitaxial spacer 14 is doped, such as, for example, in situ, by ion implantation, or by other suitable processes, with one or more types of atoms A having diffusion coefficients that are a predetermined amount less than the diffusion coefficient of the phosphorous atoms P with which silicon substrate 12 is doped. Atoms A include, for example, arsenic, antimony, and other suitable dopant atoms. Epitaxial spacer 14 is doped to a dopant concentration that is from approximately two to approximately twenty times the dopant concentration of drain region 22 and/or epitaxial layer 16, which are typically doped to a concentration of from approximately 1E14 to approximately 1E17 phosphorous atoms/cm$^{-3}$. Thus, epitaxial spacer 14 is doped from 2E14 to approximately 20E17 phosphorous atoms/cm$^{-3}$.

The specific dopant concentration to which epitaxial spacer 14 is doped is also generally dependent at least in part upon the thickness of spacer 14. More particularly, as the thickness of epitaxial spacer 14 increases the concentration to which epitaxial spacer 14 is doped must also be increased. Increasing the concentration to which epitaxial spacer 14 is doped as thickness T increases enables a given or desired (relatively small) value of $R_{DSon}$ to be achieved or maintained by reducing the per-unit resistivity of epitaxial spacer 14. Conversely, a given or desired value of $R_{DSon}$ is achieved or maintained as thickness T decreases by reducing the dopant concentration to which epitaxial spacer 14 is doped. The reduced thickness offsets the increase in per-unit resistivity resulting from a reduced dopant concentration within spacer 14.

Figure 3:
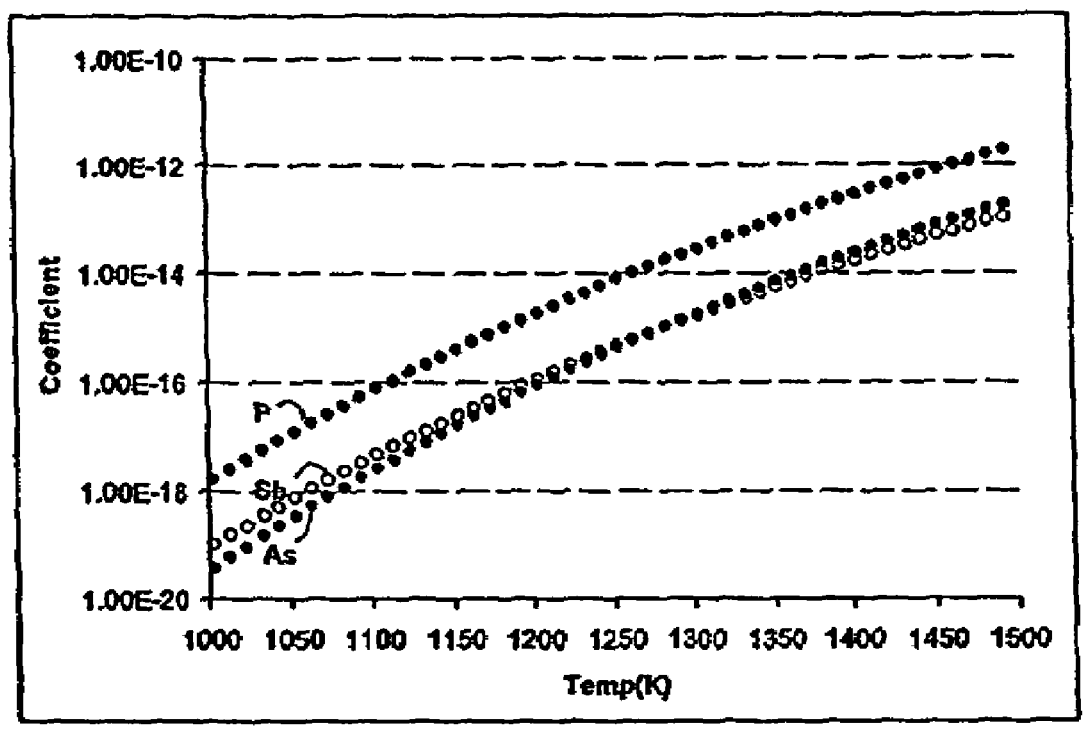
FIG. 3 plots the diffusion coefficients of phosphorous, arsenic and antimony in silicon versus temperature.

As is discussed above, epitaxial spacer 14 is doped with one or more types of atoms having diffusion coefficients that are a predetermined amount less than the diffusion coefficient of the phosphorous atoms with which the silicon substrate is doped. Examples of atoms having smaller diffusion coefficients than phosphorous include arsenic and antimony. FIG. 3 plots the diffusion coefficients of phosphorous (curve P), arsenic (curve As) and antimony (curve Sb) in silicon versus temperature, and shows that the diffusion coefficients of arsenic and antimony are approximately 100 times smaller (i.e., slower) than phosphorous. Doping epitaxial spacer 14 with atoms having slower diffusion rates than the phosphorous atoms in substrate 12 enables the concentration to which epitaxial spacer 14 is doped to be significantly increased which correspondingly and significantly reduces the resistance thereof and thereby maintains a desirably low value of $R_{DSon}$ for device 10.

It should be particularly noted that epitaxial spacer 14 can be doped to a level that is approximately the same concentration level to which a conventional arsenic-doped substrate is doped. Thus, the on-resistance of epitaxial spacer 14 is substantially less than the on-resistance of a conventional epitaxial layer of the same thickness. Further, the thicknesses of the epitaxial layers in most conventional devices are optimized for an arsenic-doped substrate. The embodiment of the present invention wherein epitaxial spacer 14 is doped with arsenic atoms to a concentration level similar to that to which conventional arsenic substrates are doped, does not significantly affect the BVDSS of device 10. In effect, the arsenic-doped epitaxial spacer 14 acts as a virtual arsenic substrate to device 10 so long as thickness T is sufficient to prevent diffusion of the phosphorous atoms into the device/active region 20. Similar benefits are obtained with an antimony-doped epitaxial spacer 14 due to the close similarity of the diffusion coefficients of the two dopants in silicon, as discussed above and shown in FIG. 3.

Figure 4:
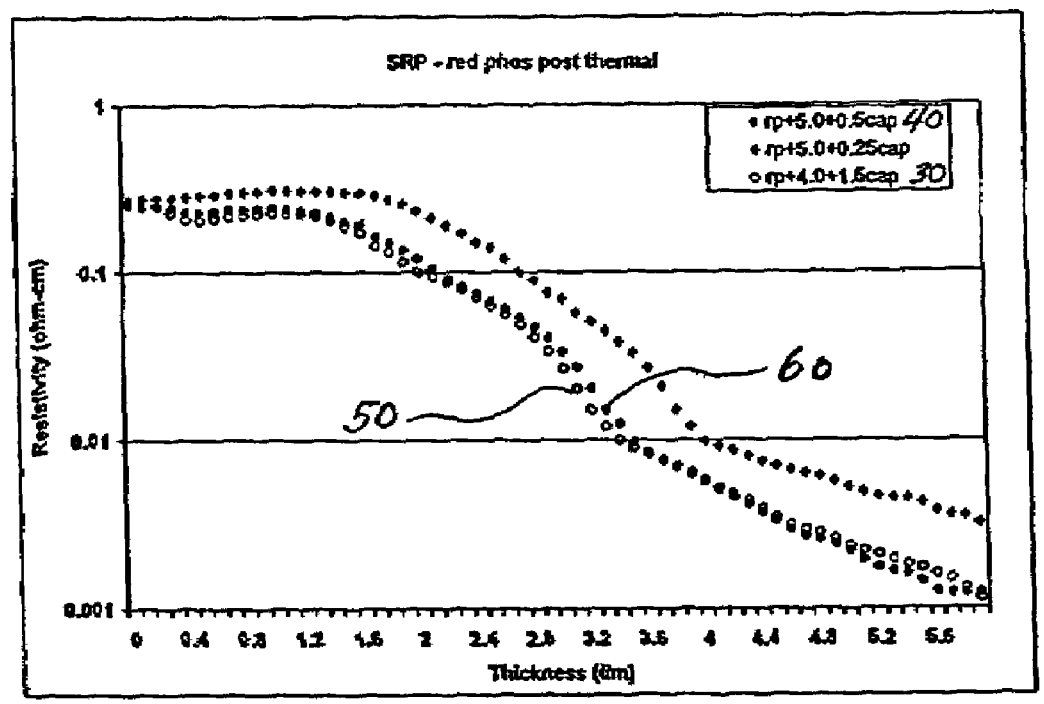
FIG. 4 plots the resistivity profiles of three different epitaxial structures formed on phosphorous-doped substrates versus thickness of the epitaxial structures.

Referring now to FIG. 4, standard resistivity profiles of three different epitaxial structures formed on phosphorous-doped substrates are plotted versus thickness after all thermal processes have been carried out for a typical advanced trench technology device. The substrates have a resistivity of approximately 0.0013 ohm-cm. Resistivity profile 50 corresponds to a structure including an intrinsic (undoped) spacer layer having a thickness of 1.5μ, and an epitaxial layer with a dopant concentration of approximately 3E16 atoms-cm$^{-3}$ (i.e., a resistivity of approximately 0.215 ohm-cm) with a thickness of approximately 4μ. Resistivity profile 60 corresponds to a structure including an intrinsic layer having a thickness of 0.5μ, a spacer layer having a thickness of approximately 1.0μ with a dopant concentration of approximately 3E16 atoms-cm$^{-3}$ (i.e., a resistivity of approximately 0.215 ohm-cm), and an epitaxial layer having a thickness of approximately 4μ also with a dopant concentration of approximately 3E16 atoms-cm$^{-3}$ (i.e., a resistivity of approximately 0.215 ohm-cm). In short, resistivity profile 50 is for a device or substrate having an undoped spacer layer whereas resistivity profile 60 is for a device or substrate having a spacer layer 14 with an increased dopant concentration (and thus a lower resistivity). The resistivity profiles 50 and 60 are virtually identical, and thereby show that the dopant concentration of the spacer layer does not impact upper diffusion. Thus, in light of the slower diffusion rates of arsenic atoms in silicon, the dopant concentration of the spacer layer is increased thereby reducing its resistance and, in turn, reducing $R_{DSon}$ of device 10.

Figure 5:
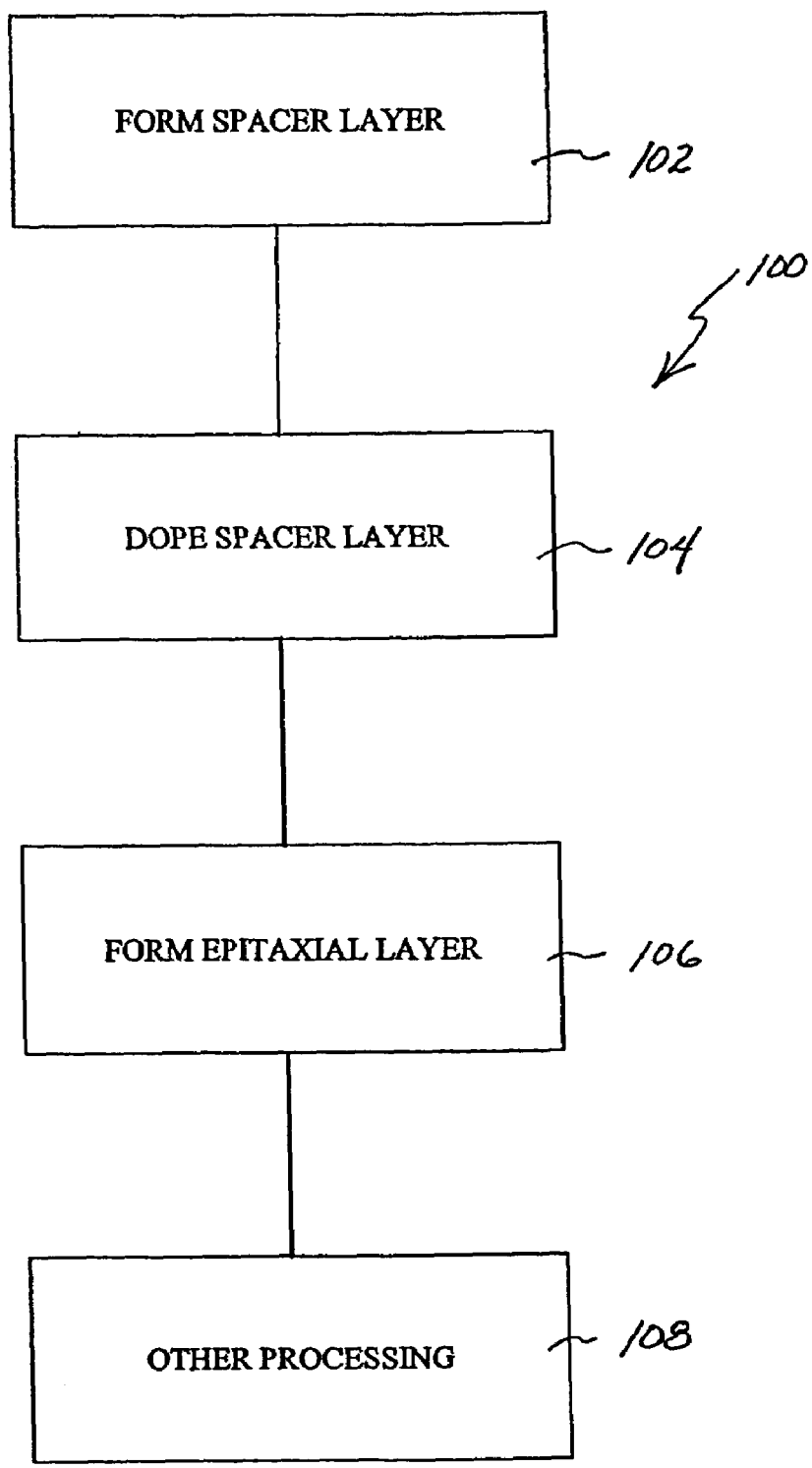
FIG. 5 shows a flow diagram of one embodiment of a method of fabricating a semiconductor device of the present invention.

Referring now to FIG. 5, one embodiment of a method of fabricating a semiconductor device of the present invention is shown. Method 100 includes the steps of forming a spacer layer 102, doping the spacer layer 104, forming an epitaxial layer 106, and other processing 108.

The process of forming spacer layer 102 includes forming, such as, for example, by epitaxial growth, a spacer layer of a predetermined or desired thickness over a phosphorous-doped silicon substrate. The process of doping spacer layer 104 includes doping the spacer layer with dopant atoms that diffuse in silicon more slowly than phosphorous atoms, such as, for example, arsenic and/or antimony or any other suitable dopant atoms. The process of doping spacer layer 104 may be integral and/or be simultaneous with the process of forming spacer layer 102. The process of forming device epitaxial layer 106 includes forming, such as, for example, by epitaxial growth, a device epitaxial layer having a predetermined or desired thickness over the spacer layer. Other processing 108 includes standard and conventional substrate and integrated circuit fabrication processes known in the art.

In the embodiment shown, device 10 is depicted as a trench-gated MOSFET. However, it is to be understood that the device of the present invention can be alternately configured, such as, for example, a trench device of a different technology family and/or a planar device.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed is:

1. A semiconductor device, comprising;
   a silicon substrate heavily-doped with phosphorous;
   a spacer layer disposed over said substrate, said spacer layer being doped with dopant atoms having a diffusion coefficient in said spacer layer that is less than a diffusion coefficient of phosphorous in silicon;
   an epitaxial layer disposed over said substrate; and
   a device layer disposed over said substrate, and over said epitaxial layer and said spacer layer;
   wherein diffusion of phosphorous atoms from said heavily-doped silicon substrate to said device layer are substantially reduced.

2. The semiconductor device of claim 1, wherein said spacer layer is disposed intermediate said substrate and said epitaxial layer.

3. The semiconductor device of claim 1, wherein said spacer layer comprises epitaxial silicon.

4. The semiconductor device of claim 1, wherein said dopant atoms include at least one of arsenic and antimony.

5. The semiconductor device of claim 1, wherein said substrate has a dopant concentration of approximately 5E18 phosphorous atoms/cm.−3 or greater.

6. The semiconductor device of claim 1, wherein said spacer layer has a dopant concentration of from approximately 2E14 to approximately 20E17 phosphorous atoms/cm−3.

7. The semiconductor device of claim 1 wherein the spacer layer is on the substrate.

8. The semiconductor device of claim 1 wherein the spacer layer is in the substrate.

9. The semiconductor device of claim 1 wherein the epitaxial layer is on the spacer layer.

10. The semiconductor device of claim 1 wherein the polarity of the dopants in the substrate and the spacer layer are the same.

11. The semiconductor device of claim 1 wherein the polarity of the dopants in the substrate, the spacer layer, and the epitaxial layer are the same.

12. A metal oxide semiconductor field effect transistor, comprising:
   a silicon substrate heavily-doped with phosphorous;
   a spacer layer disposed over said substrate, said spacer layer being doped with dopant atoms having a diffusion coefficient in said spacer layer that is less than a diffusion coefficient of phosphorous in silicon;
   an epitaxial layer disposed over said substrate; and
   a device layer disposed over said substrate, and over said epitaxial layer and said spacer layer;
   wherein diffusion of phosphorous atoms from said heavily-doped silicon substrate to said device layer are substantially reduced.

13. The metal oxide semiconductor field effect transistor of claim 12, wherein said spacer layer is disposed intermediate said substrate and said epitaxial layer.

14. The metal oxide semiconductor field effect transistor of claim 12, wherein said spacer layer comprises epitaxial silicon.

15. The metal oxide semiconductor field effect transistor of claim 12, wherein said dopant atoms include at least one of arsenic and antimony.

16. The metal oxide semiconductor field effect transistor of claim 12, wherein said substrate has a dopant concentration of approximately 5E18 phosphorous atoms/cm.−3 or greater.

17. The metal oxide semiconductor field effect transistor of claim 12, wherein said spacer layer has a dopant concentration of from approximately 2E14 to approximately 20E17 phosphorous atoms/cm−3.

18. A semiconductor structure, comprising:
   a silicon substrate heavily-doped with phosphorous;
   a spacer layer disposed over said substrate, said spacer layer being doped with dopant atoms having a diffusion coefficient in said spacer layer that is less than a diffusion coefficient of phosphorous in silicon;
   an epitaxial layer disposed over said substrate;
   wherein diffusion of phosphorous atoms from said heavily-doped silicon substrate are substantially reduced.

19. The semiconductor structure of claim 18, wherein said spacer layer is disposed intermediate said substrate and said epitaxial layer.

20. The semiconductor structure of claim 18, wherein said spacer layer comprises epitaxial silicon.

21. The semiconductor structure of claim 18, wherein said dopant atoms include at least one of arsenic and antimony.

22. The semiconductor structure of claim 18, wherein said substrate has a dopant concentration of approximately 5E18 phosphorous atoms/cm.31 3 or greater; and said spacer layer has a dopant concentration of from approximately 2E14 to approximately 20E17 phosphorous atoms/cm−3.

23. The semiconductor device of claim 18 wherein the spacer layer is on the substrate.

24. The semiconductor device of claim 18 wherein the spacer layer is in the substrate.

25. The semiconductor device of claim 18 wherein the epitaxial layer is on the spacer layer.

26. The semiconductor device of claim 18 wherein the polarity of the dopants in the substrate and the spacer layer are the same.

27. The semiconductor device of claim 18 wherein the polarity of the dopants in the substrate, the spacer layer, and the epitaxial layer are the same.

28. A semiconductor device, comprising:
a silicon substrate heavily-doped with phosphorous;
a spacer layer disposed over said substrate, said spacer layer being doped with dopant atoms having a diffusion coefficient in said spacer layer that is less than a diffusion coefficient of phosphorous in silicon;
an epitaxial layer disposed over said substrate;
a drain region within said epitaxial layer; and
a device layer disposed over said drain region.

29. The semiconductor device of claim 28, wherein said device layer includes one or more well regions, body regions, and source regions.

30. The semiconductor device of claim 29, wherein said device layer further includes one or more gate trenches, a dielectric material lining said gate trenches, and a conductive gate material disposed over said dielectric material and within said gate trenches.

31. The semiconductor device of claim 28 wherein said spacer layer is doped from approximate two to twenty times a dopant concentration of said epitaxial layer.

32. The semiconductor device of claim 31, wherein said spacer layer is doped to a dopant concentration of from 2E14 to approximately 20E17 atoms/cm−3.

33. The semiconductor device of claim 28 wherein said dopant atoms are selected from a group including arsenic and antimony.

34. The semiconductor device of claim 28 wherein the spacer layer is on the substrate.

35. The semiconductor device of claim 28 wherein the spacer layer is in the substrate.

36. The semiconductor device of claim 28 wherein the epitaxial layer is on the spacer layer.

37. The semiconductor device of claim 28 wherein the polarity of the dopants in the substrate and the spacer layer are the same.

38. The semiconductor device of claim 28 wherein the polarity of the dopants in the substrate, the spacer layer, and the epitaxial layer are the same.

* * * * *